(12) United States Patent
Wekhande

(10) Patent No.: US 7,219,022 B2
(45) Date of Patent: May 15, 2007

(54) METHODS AND APPARATUS FOR DETECTING FAILURE OF AN ISOLATION DEVICE

(75) Inventor: Shashank S. Wekhande, Nashua, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 26 days.

(21) Appl. No.: 11/171,789

(22) Filed: Jun. 30, 2005

(65) Prior Publication Data
US 2007/0005274 A1   Jan. 4, 2007

(51) Int. Cl.
*G06F 19/00* (2006.01)

(52) U.S. Cl. ............... 702/58; 702/117; 702/124; 324/500; 324/415; 324/719; 361/90; 361/79; 327/427; 327/437

(58) Field of Classification Search ........... 702/57–59, 702/64, 108, 117, 118, 124, 126, 183, 185, 702/189; 324/500, 522, 541, 551, 769, 415, 324/537, 76.83, 76.54, 600, 421, 424, 713, 324/719; 361/90, 92, 5, 18, 88, 94, 65, 78, 361/13, 100, 7, 79; 327/427, 434, 435, 437
See application file for complete search history.

(56) References Cited

U.S. PATENT DOCUMENTS

| | | | | |
|---|---|---|---|---|
| 5,448,441 A | * | 9/1995 | Raposa | 361/18 |
| 5,528,445 A | * | 6/1996 | Cooke et al. | 361/20 |
| 5,726,997 A | * | 3/1998 | Teene | 714/726 |
| 6,612,502 B2 | * | 9/2003 | Poucher | 236/78 D |
| 6,615,146 B1 | | 9/2003 | Malik et al. | |

* cited by examiner

*Primary Examiner*—Marc S. Hoff
*Assistant Examiner*—Elias Desta
(74) *Attorney, Agent, or Firm*—Daly, Crowley, Mofford & Durkee, LLP

(57) ABSTRACT

Apparatus for detecting failure of an isolation device includes a current sensor to sense current through the isolation device and a circuit responsive to the current sensor output signal and to an enable signal that controls the isolation device for providing an Early Failure Warning (EFW) signal indicative of whether the isolation device has failed. The enable signal is at a first logic level when the isolation device is on and is brought to a second logic level to disable and test the isolation device. Also described is a method of detecting a failure of an isolation device including disabling the isolation device, sensing a current through the isolation device, and providing an EFW signal indicating that the isolation device has failed if the current through the isolation device is greater than a predetermined level when the isolation device is disabled.

17 Claims, 2 Drawing Sheets

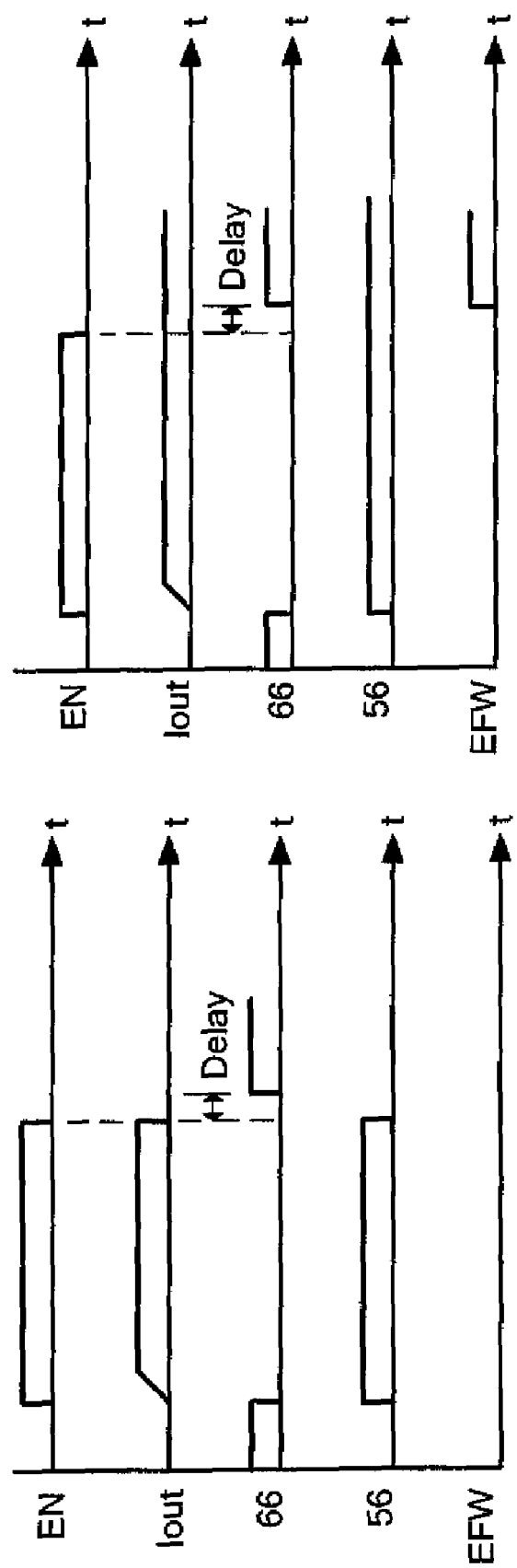

METHODS AND APPARATUS FOR DETECTING FAILURE OF AN ISOLATION DEVICE

CROSS-REFERENCE TO RELATED APPLICATIONS

Not Applicable.

STATEMENT REGARDING FEDERALLY SPONSORED RESEARCH

Not Applicable.

FIELD OF THE INVENTION

The invention relates to providing an Early Failure Warning (EFW) signal for an isolation device that is used to protect a system in the event of an actual fault and, more particularly, to methods and apparatus for detecting failure of the isolation device and providing the EFW signal.

BACKGROUND OF THE INVENTION

Various types of power systems use a switch, such as a Metal Oxide Semiconductor Field Effect Transistor (MOSFET), to isolate circuit nodes or elements, for example to isolate a voltage bus from a load, in the event of fault, such as a short circuit or overload condition. In a typical configuration of this type, the switch is coupled in series between the bus and the load. The switch is normally on and, in the event of a short circuit or overload condition, the switch turns off to isolate the circuit nodes. The isolation device and associated circuitry may be designed to protect against a short circuit on the bus and/or in the load or various other types of fault conditions. The bus may be provided by a power supply or converter, a plurality of parallel converters, a motor driver, or a UPS, as just a few examples.

One such power system is described in a U.S. Pat. No. 6,615,146 entitled "Failure Detection of an Isolation Device with PFA Signal Generation in a Redundant Power Supply System" to Malik et al., in which a MOSFET isolation device is coupled in series within a power supply of a redundant power supply system. When a short circuit occurs on a voltage input line of the power supply, Vin, the switch is turned off to isolate the power supply from the bus.

In the '146 circuit, a predictive failure analysis (PFA) signal is generated when the isolation device fails, thereby advantageously signaling the presence of a failure of the isolation device. More particularly, if the gate, drain and source of the switch all short together, then the voltage on the gate, VMONITOR, will be at the same value as the Vout voltage, causing the PFA signal to go low, thereby indicating a failure of the switch.

SUMMARY OF THE INVENTION

According to the invention, apparatus for detecting failure of an isolation device and providing an Early Failure Warning (EFW) signal includes a current sensor coupled to provide an output signal indicative of a current through the isolation device and a circuit responsive to the current sensor output signal and to an enable signal that controls the isolation device for providing the EFW signal indicative of whether the isolation device has failed.

With this arrangement, the EFW signal provides an indication of isolation device failure. Advantageously, the EFW signal permits the isolation device to be replaced before an actual system fault condition, such as an output short circuit, occurs and causes damage.

In one embodiment, the circuit includes a comparator having a first input responsive to the current sensor output signal, a second input coupled to a reference voltage, and an output at which is provided a control signal indicative of whether the output current Iout is greater than a predetermined level corresponding to an isolation device failure. A logic circuit is responsive to the comparator output signal and to the enable signal for providing the EFW signal.

A delay element is provided for delaying the enable signal to provide a delayed enable signal to the logic circuit. In one embodiment, the logic circuit is an AND gate responsive to the delayed enable signal and to the current sensor output signal.

The apparatus may include a second comparator having a first input responsive to a sensor output signal, a second input coupled to a second reference voltage, and an output at which is provided a second control signal indicative of whether the sensor output signal is greater than a second predetermined level established by the second reference voltage. In one illustrative embodiment implementing overcurrent protection, the sensor output signal is provided by the current sensor and the second control signal is indicative of whether the output current Iout has exceeded a predetermined level corresponding to a maximum current level. A second logic circuit is responsive to the second control signal and to the enable signal for generating a drive signal to cause the isolation device to turn on when the sensor output signal is less than the second predetermined level and the enable signal is at a predetermined logic level.

Also described is a method of detecting a failure of an isolation device including disabling the isolation device, sensing a current through the isolation device, and providing an EFW signal indicating that the isolation device has failed if the current through the isolation device is greater than a predetermined level when the isolation device is disabled.

The enable signal is normally at a first logic level to enable the isolation device and is brought to a second logic level to disable the isolation device, as may occur periodically, during shutdown for system maintenance or during normal shutdown. In one embodiment, the enable signal is delayed to provide a delayed enable signal, a comparator output signal is provided to indicate whether the current through the isolation device is greater than a predetermined level, and an AND gate is responsive to the delayed enable signal and to the comparator output signal to provide the EFW signal.

BRIEF DESCRIPTION OF THE DRAWINGS

The advantages and aspects of the present invention will be more fully understood in conjunction with the following detailed description and accompanying drawings, wherein:

FIG. 2 shows several waveforms associated with the failure detection circuit of FIG. 1 under normal operating conditions; and FIG. 2A shows several waveforms associated with the failure detection circuit of FIG. 1 when the isolation device fails.

DETAILED DESCRIPTION

Figure 1:
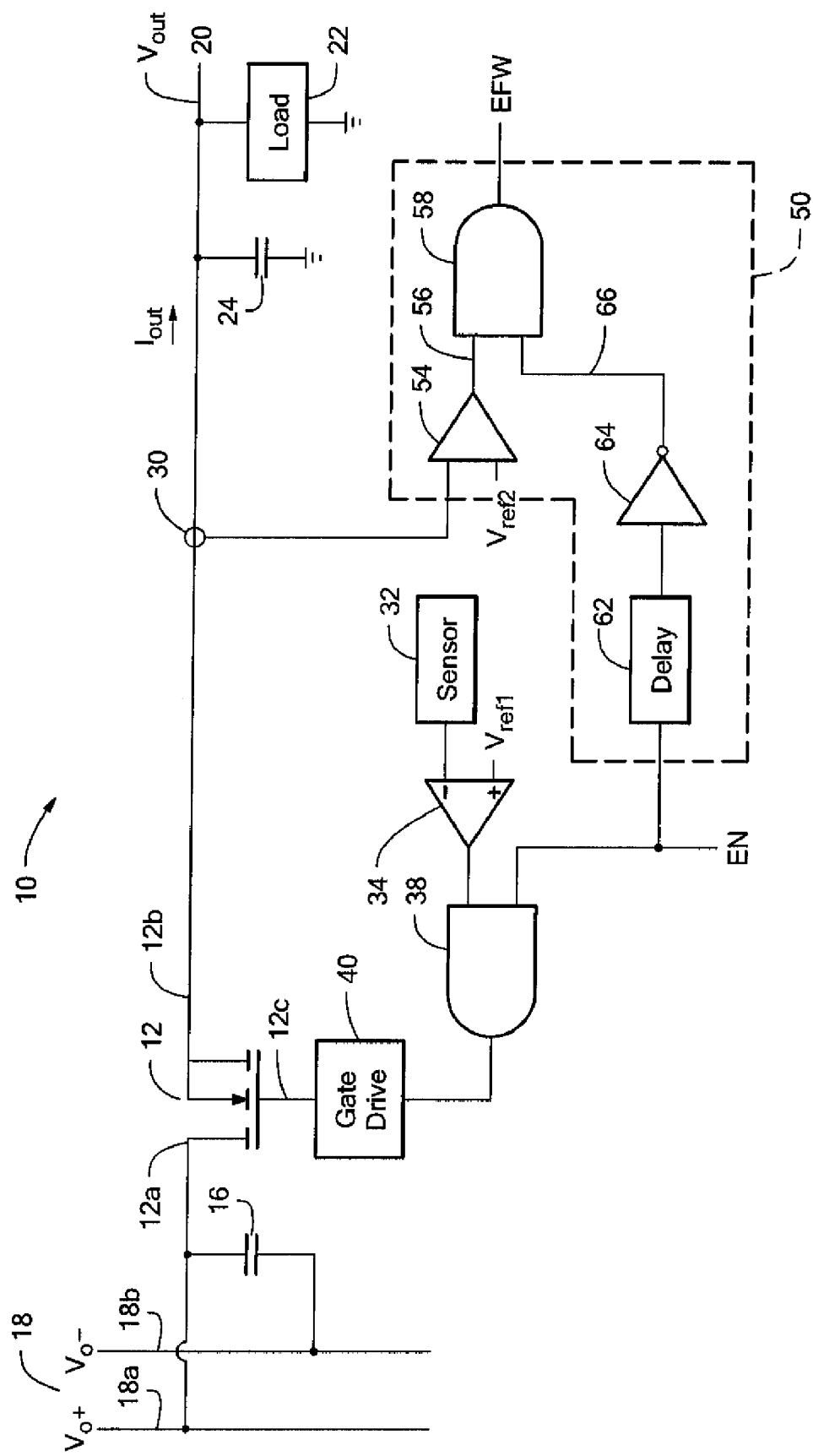
FIG. 1 is a schematic of a circuit for detecting failure of an isolation device and providing an EFW signal according to the invention.

Referring to FIG. 1, a fault protection circuit 10 includes an isolation device 12, here coupled in series between a power supply bus 18 and an output load circuit node 20 across which an output capacitor 24 and a load 22 are coupled. According to the invention, a circuit 50 is provided for detecting failure of the isolation device 12 and for providing an Early Failure Warning (EFW) signal indicative of failure of the isolation device.

The illustrated isolation device 12 is a MOSFET having a drain terminal 12a coupled to the power supply bus 18, a source terminal 12b at which the output voltage, Vout, is provided and a gate terminal 12c. The isolation device 12 may alternatively take the form of a mechanical relay, an Insulated Gate Bipolar Transistor (IGBT) or other suitable forms. The isolation device 12 may be referred to generally as a switch.

The power supply bus 18 includes voltage rails Vo+, Vo− 18a, 18b and may be provided by a single power supply or alternatively, by a parallel combination of a plurality redundant power supplies. Similarly, the load 22 may represent a single load device or alternatively, may comprise multiple load devices coupled in series or in parallel.

More generally, the isolation device 12 may be coupled between any circuit nodes or elements desired to be isolated in the event of a fault condition, of which the illustrated power supply bus 18 and output circuit node 20 provide one example. As a further example, the isolation device may be provided within a power supply and coupled between a voltage input line and a power system bus, as in the above-referenced U.S. Pat. No. 6,615,146. The invention will be described herein in connection with isolation device 12 capable of isolating power supply bus 18 from output node 20, but it will be appreciated by those of ordinary skill in the art that the invention is suitable for use with an isolation device coupled to isolate any desired circuit nodes or elements.

The circuit 10 includes a first comparator 34 having a first input coupled to a sensor 32 and a second input responsive to a reference voltage, Vref1. The output signal of comparator 34 is coupled to an input of a logic circuit 38, here in the form of an AND gate. An enable signal, EN, is coupled to the second input of the AND gate 38 and the output signal of the AND gate 38 is coupled to a gate drive circuit 40, such as may be provided by a conventional charge pump arrangement suitable for providing sufficient gate voltage to turn on the FET 12. When the output signal of AND gate 38 is at a logic high level, the gate drive 40 provides sufficient voltage to the gate terminal 12c to turn on the switch 12 and when the output signal of the AND gate 38 is at a logic low level, the gate drive 40 does not provide sufficient voltage to the gate terminal 12c and the switch 12 is off.

The sensor 32 can take different forms depending on the type of fault condition desired to be protected against. For example, in one embodiment in which the fault protection circuit 10 protects against a short circuit or overload condition, the sensor 32 may be provided by a current sensor, such as the illustrated current sensor 30. In an alternative embodiment in which the fault protection circuit 10 protects against an overtemperature condition, the output of the sensor 32 may be a temperature sensor. As a further alternative, if it is desired to protect against an overvoltage condition, the sensor 32 may be provided by the Vout voltage at node 20. It will be appreciated by those of ordinary skill in the art that other types of applications for fault protection circuit 10 are possible, in which case the sensor 32 can be provided by different types of sensors.

The fault protection circuit 10 is described herein as protecting against a short circuit or overload condition, with the sensor 32 provided by the illustrated current sensor 30. Current sensor 30 senses a load current, or output current, Iout, flowing through the isolation device and may be coupled between the bus 18 and the switch 12 or between the switch 12 and the load 22, as shown. The current sensor 30 may be provided in various suitable forms. In the illustrative embodiment, the sensor is a Hall effect sensor and may take the same form as that provided in the ACS704ELC-005 product of Allegro Microsystems, Inc. of Worcester, Mass., for example. However, other types of current sensors may also be suitable, such as a sensor including a gapped toroid magnetic flux concentrator with the Hall effect element positioned in the toroid gap, or a shunt resistor.

In normal operation, the isolation device 12 is on, or closed, thereby coupling the power supply bus 18 to the output node 20. More particularly, the enable signal EN is normally high and, in the illustrative overcurrent fault protection embodiment, the reference voltage Vref1 is selected to provide the output signal of comparator 34 at a logic high level when the output current level is less than a first predetermined level corresponding to a specified maximum current level. Thus, under these operating conditions, the two inputs to the AND gate 38 are high, thereby causing the AND gate output to be high and the gate drive 40 to turn on the device 12. In one illustrative embodiment, the first predetermined level is approximately 1.2V volts, corresponding to an output current Iout of approximately 20 amps.

When a system fault occurs, such as a short circuit or overload condition in the illustrative embodiment, the device 12 turns off, or opens, thereby isolating the bus 18 from the load 22. More particularly, such fault conditions will cause a greater level of output current Iout to flow than the specified maximum current level. Thus, this will cause the output signal of comparator 34 to go low, thereby causing the output signal of the AND gate 38 to go low and the gate drive 40 to turn off the device 12.

According to the invention, the fault protection circuit 10 includes a circuit 50 for detecting failure of the isolation device 12. In particular, the circuit 50 includes a comparator 54 having a first input coupled to the current sensor 30 and a second input responsive to a second reference voltage, Vref2, corresponding to an isolation device failure. The output signal of comparator 54 is coupled to an input of a logic circuit 58, here an AND gate, that provides the EFW signal indicative of failure of the switch 12. A delay element 62 is provided for generating a delayed version of the enable signal, as shown. The output signal of the delay element 62 is coupled to an inverter 64, the output of which is coupled to the second input of the AND gate 58.

The EFW signal is indicative of whether the isolation device 12 has failed. In the illustrative embodiment, a logic low EFW signal indicates that the isolation device is functioning properly and a logic high EFW signal indicates that the isolation device has failed The operation of the circuit 50 will be described with reference to FIGS. 2 and 2A. FIG. 2 shows various waveforms associated with the circuit 50 under normal operating conditions. In particular, FIG. 2 shows the enable signal EN, the output current Iout, the output signal 56 of comparator 54, the output signal 66 of inverter 64, and the EFW signal.

In operation, when the enable signal EN, which is normally high, is brought to a logic low level, the isolation device 12 is "tested". The enable signal EN may be generated by various mechanisms, such as a microprocessor or other controller or a manual switch as examples, and may be brought low under various conditions, as is desired for a particular application. For example, the enable signal EN may be brought low for system shutdown for maintenance reasons or during normal shutdown. Or, alternatively, the EN signal may be brought low periodically, for testing purposes if desired.

When the enable signal EN goes low, the device 12 turns off. As is expected, the output current Iout goes to zero when the device 12 turns off, as shown. At some time interval after the enable signal EN goes low, the delayed, inverted version of the enable signal, signal 66, goes high as shown. However, because the output current Iout has fallen to zero, and more particularly, below a second predetermined level corresponding to a level indicative of the device 12 being off, as established by reference voltage Vref2, the output signal 56 of comparator 54 is low, thereby causing the EFW signal to stay low, to indicate that the isolation device is operating properly. In one illustrative embodiment, the reference voltage Vref2 is on the order of 60 mV volts, corresponding to an output current Iout of approximately 1 amp.

Referring also to FIG. 2A, the same waveforms as in FIG. 2 are shown. Here however, a failure occurs in the isolation device 12, as illustrated by the output current Iout continuing to flow even when the EN signal goes low to turn off the isolation device. Such a failure may manifest itself as a short between the drain terminal 12a and the source terminal 12b or as a short between all three FET terminals 12a, 12b, and 12c, as examples. In any event, a failure of the isolation device 12 permits output current Iout to flow even when the voltage applied to the gate terminal 12c dictates that the FET should be off.

At some time interval after the enable signal EN goes low, the delayed, inverted version of the enable signal, signal 66, goes high as shown. Here, because the output current Iout continues to flow, and more particularly, the level of the output current Iout exceeds the second predetermined level established by reference voltage Vref2, the output signal 56 of comparator 54 is high, thereby causing the EFW signal to go high as shown, to indicate that the isolation device has failed.

The purpose of the delay element 62 is to permit some time to pass for the output current Iout to fall to the second predetermined level, in order to avoid falsely indicating an isolation device failure. In the illustrative embodiment, the delay element is provided in the form of an RC circuit with a time constant on the order of a few milliseconds. However, it will be appreciated by those of ordinary skill in the art that other types of delay elements, circuits, or techniques are possible to achieve substantially the same result.

Having described the preferred embodiments of the invention, it will now become apparent to one of ordinary skill in the art that other embodiments incorporating their concepts may be used.

It will also be appreciated that while particular circuit elements and even logic signal levels have been described in order to explain the inventive concepts, the embodiments of the invention should not be limited to the disclosed embodiments, but rather should be limited only by the spirit and scope of the appended claims.

What is claimed is:

1. Apparatus for detecting failure of an isolation device, comprising:
   a switch coupled between a bus and a load and responsive to an enable signal;
   a current sensor coupled in series with the switch to provide a current sensor output signal indicative of the level of current through the switch;
   a comparator having a first input responsive to the current sensor output signal, a second input coupled to a reference voltage, and an output at which is provided a control signal indicative of whether the current through the switch is greater than a predetermined level established by the reference voltage; and
   a logic circuit responsive to the control signal and to the enable signal for providing an EFW signal indicative of whether the switch has failed.

2. The apparatus of claim 1 further comprising a delay element for delaying the enable signal to provide a delayed enable signal to the logic circuit.

3. The apparatus of claim 2 wherein the logic circuit comprises an AND gate responsive to the delayed enable signal and to the current sensor output signal.

4. The apparatus of claim 1 further comprising a second comparator having a first input responsive to a sensor output signal, a second input coupled to a second reference voltage, and an output at which is provided a second control signal indicative of whether the sensor output signal is greater than a second predetermined level established by the second reference voltage.

5. The apparatus of claim 4 wherein the sensor output signal is provided by the current sensor output signal and further comprising a second logic circuit responsive to the second control signal and to the enable signal for generating a drive signal to cause the switch to turn on when the current through the switch is less than the second predetermined level and the enable signal is at a predetermined logic level.

6. The apparatus of claim 5 wherein the second logic circuit comprises an AND gate responsive to the second control signal and to the enable signal.

7. The apparatus of claim 4 wherein the sensor output signal is provided by a voltage at the load.

8. The apparatus of claim 4 wherein the sensor output signal is provided by a temperature sensor.

9. A method of detecting a failure of an isolation device coupled between a bus and a load, comprising:
   disabling the isolation device;
   sensing a current through the isolation device; and
   providing an EFW signal indicating that the isolation device has failed if the current through the isolation device is greater than a predetermined level when the isolation device is disabled.

10. The method of claim 9 wherein disabling the isolation device includes providing an enable signal to the isolation device, the enable signal being at a first logic level to enable the isolation device and being at a second logic level to disable the isolation device.

11. The method of claim 10 further comprising delaying the enable signal to provide a delayed enable signal.

12. The method of claim 11 further comprising providing a comparator output signal indicative of whether the current through the isolation device is greater than a predetermined level.

13. The method of claim 12 wherein providing the EFW signal includes providing an AND gate responsive to the delayed enable signal and to the comparator output signal.

14. Apparatus for detecting failure of an isolation device coupled between a bus and a load comprising:
   a current sensor coupled to provide a current sensor output signal indicative of a current through the isolation device; and a circuit responsive to the current sensor output signal and to an enable signal that controls the isolation device for providing an EFW signal indicative of whether the isolation device has failed.

15. The apparatus of claim 14 wherein the circuit comprises a comparator having a first input responsive to the current sensor output signal, a second input coupled to a reference voltage, and an output at which is provided a control signal indicative of whether the output current Iout is greater than a predetermined level established by the reference voltage; and a logic circuit responsive to the comparator output signal and to the enable signal for providing an EFW signal indicative of whether the isolation device has failed.

16. The apparatus of claim 15 further comprising a delay element for delaying the enable signal to provide a delayed enable signal to the logic circuit.

17. The apparatus of claim 16 wherein the logic circuit comprises an AND gate responsive to the delayed enable signal and to the current sensor output signal.

* * * * *

UNITED STATES PATENT AND TRADEMARK OFFICE
CERTIFICATE OF CORRECTION

PATENT NO. : 7,219,022 B2  Page 1 of 1
APPLICATION NO. : 11/171789
DATED : May 15, 2007
INVENTOR(S) : Wekhande It is certified that error appears in the above-identified patent and that said Letters Patent is hereby corrected as shown below:

Col. 3, line 21-22, delete "plurality redundant" and replace with --plurality of redundant--.

Col. 7, line 5-6, delete "comprises" and replace with --comprises:--.

Signed and Sealed this

Fourteenth Day of August, 2007

JON W. DUDAS
*Director of the United States Patent and Trademark Office*